US010606284B2

(12) United States Patent
Coq et al.

(10) Patent No.: US 10,606,284 B2
(45) Date of Patent: Mar. 31, 2020

(54) SELF-ACTUATING DEVICE FOR FACILITATING PREVENTING PRODUCT TIP OVER

(71) Applicant: INTERNATIONAL BUSINESS MACHINES CORPORATION, Armonk, NY (US)

(72) Inventors: Marc H. Coq, Hopewell Junction, NY (US); Michael D. O'Connell, Rochester, MN (US); Sharon T. Spaulding, Highland, NY (US); William J. Green, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/456,050

(22) Filed: Jun. 28, 2019

(65) Prior Publication Data
US 2019/0354119 A1 Nov. 21, 2019

Related U.S. Application Data

(63) Continuation of application No. 15/984,602, filed on May 21, 2018, now Pat. No. 10,452,080.

(51) Int. Cl.
G05D 3/20 (2006.01)
B65D 19/38 (2006.01)
(Continued)

(52) U.S. Cl.
CPC .............. G05D 3/20 (2013.01); A47B 97/00 (2013.01); B65D 19/38 (2013.01); F16M 7/00 (2013.01);
(Continued)

(58) Field of Classification Search
CPC ...... G05D 3/20; F16M 7/00; F16M 2200/044; F16M 2200/08; A47B 97/00;
(Continued)

(56) References Cited

U.S. PATENT DOCUMENTS 1,932,031 A * 10/1933 Saverio ................... B60R 21/00
                                                        280/755
3,150,904 A *  9/1964 Kendt .................... A47L 15/427
                                                        312/276
(Continued)

FOREIGN PATENT DOCUMENTS

CA      2 785 111 A1    2/2013
CN      204979459 U     1/2016
(Continued)

OTHER PUBLICATIONS https://web.archive.org/web/20171121094912/https://learn.adafruit.com/tilt-sensor/overview: Adafruit: Nov. 21, 2017 https://learn.adafruit.com/tilt-sensor/overview Adafruit (Nov. 21, 2017) (Year:2017).
(Continued)

Primary Examiner — Muhammad Ijaz
(74) Attorney, Agent, or Firm — Tihon Poltavets, Esq.; Kevin P. Radigan, Esq.; Heslin Rothenberg Farley & Mesiti P.C.

(57) ABSTRACT

A self-actuating device and method for facilitating preventing product tip over are provided. The self-actuating device includes an anti-tip mechanism associated with a product to facilitate preventing tip over of the product when in an extended state. Further, the self-actuating device includes an actuator associated with the product. The actuator is configured and operatively coupled to automatically switch the anti-tip mechanism from a retracted state to the extended state based on the actuator detecting a tilt of a specified tilt angle.

9 Claims, 14 Drawing Sheets

(51) Int. Cl.
*F16M 7/00* (2006.01)
*A47B 97/00* (2006.01)
*H05K 7/14* (2006.01)

(52) U.S. Cl.
CPC .............. *A47B 2097/008* (2013.01); *B65D 2519/00776* (2013.01); *F16M 2200/044* (2013.01); *F16M 2200/08* (2013.01); *H05K 7/1495* (2013.01)

(58) Field of Classification Search
CPC .............. A47B 2097/008; B65D 19/38; B65D 2519/00776; H05K 7/1495
USPC ........................................ 248/550, 651, 681
See application file for complete search history.

(56) References Cited

U.S. PATENT DOCUMENTS

| | | | |
|---|---|---|---|
| 3,262,582 | A | 7/1966 | Pittman et al. |
| 5,007,522 | A | 4/1991 | Focke et al. |
| 5,180,060 | A | 1/1993 | Forti et al. |
| 5,351,829 | A | 10/1994 | Batsford |
| 5,995,001 | A | 11/1999 | Wellman et al. |
| 6,394,738 | B1 * | 5/2002 | Springer ................ B62D 49/08 187/232 |
| 7,549,664 | B2 * | 6/2009 | Bozung .................. B62H 1/06 280/293 |
| 9,743,543 | B2 * | 8/2017 | Anderson ............ H05K 5/0234 |
| 2010/0162835 | A1 | 7/2010 | Lee et al. |
| 2017/0273212 | A1 | 9/2017 | Davis et al. |
| 2019/0159358 | A1 * | 5/2019 | Chen .................... H05K 7/1489 |

FOREIGN PATENT DOCUMENTS

| | | |
|---|---|---|
| DE | 10-2004028053 A1 | 12/2005 |
| EP | 1 985 576 A2 | 10/2008 |
| GB | 1 395 016 | 11/1972 |
| JP | H0995219 A | 4/1997 |
| WO | WO 2004/091265 A2 | 10/2004 |
| WO | WO 2017/141563 A1 | 8/2017 |

OTHER PUBLICATIONS

Coq, et al., "Tip-Over Prevention Apparatus," U.S. Appl. No. 15/915,873, filed Mar. 8, 2018 (19 pages).

Coq, et al., "Self-Actuating Device for Facilitating Preventing Product Tip Over," U.S. Appl. No. 15/984,602, filed May 21, 2018 (37 pages).

Coq, et al., "Self-Actuating Device for Facilitating Preventing Product Tip Over," U.S. Appl. No. 16/456,008, filed Jun. 28, 2019 (35 pages).

Coq et al., "List of IBM Patents and/or Patent Applications Treated as Related", U.S. Appl. No. 16/456,050, filed Jun. 28, 2019, dated Jun. 28, 2019 (2 pages).

* cited by examiner

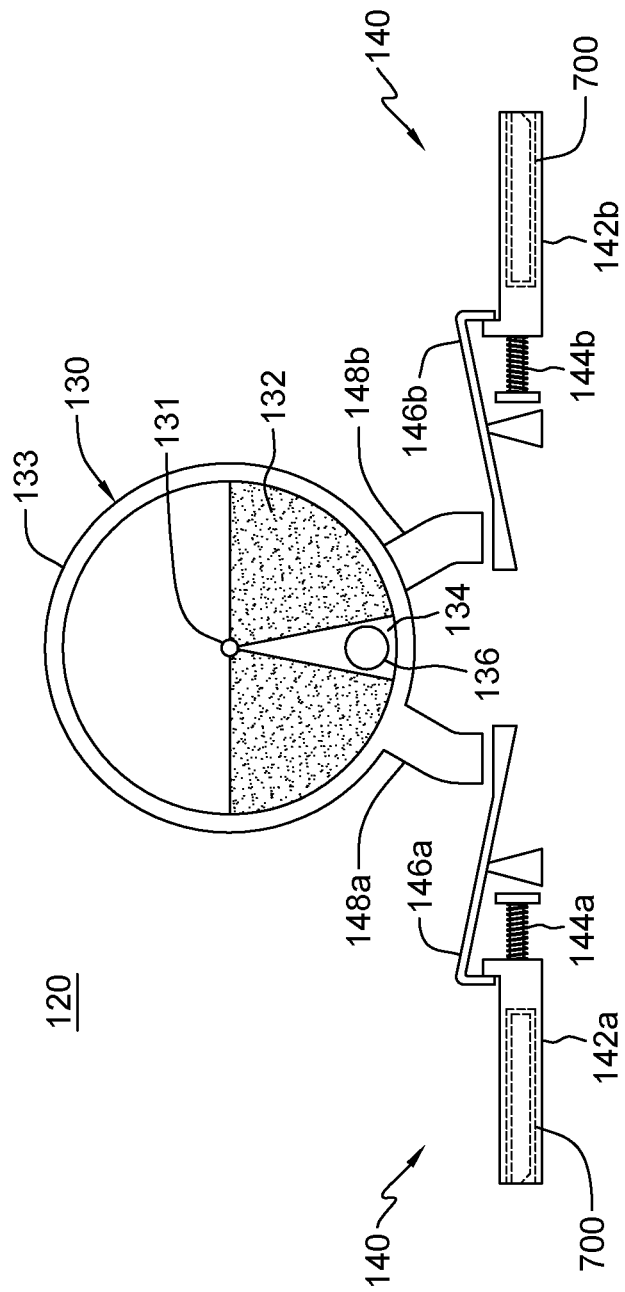

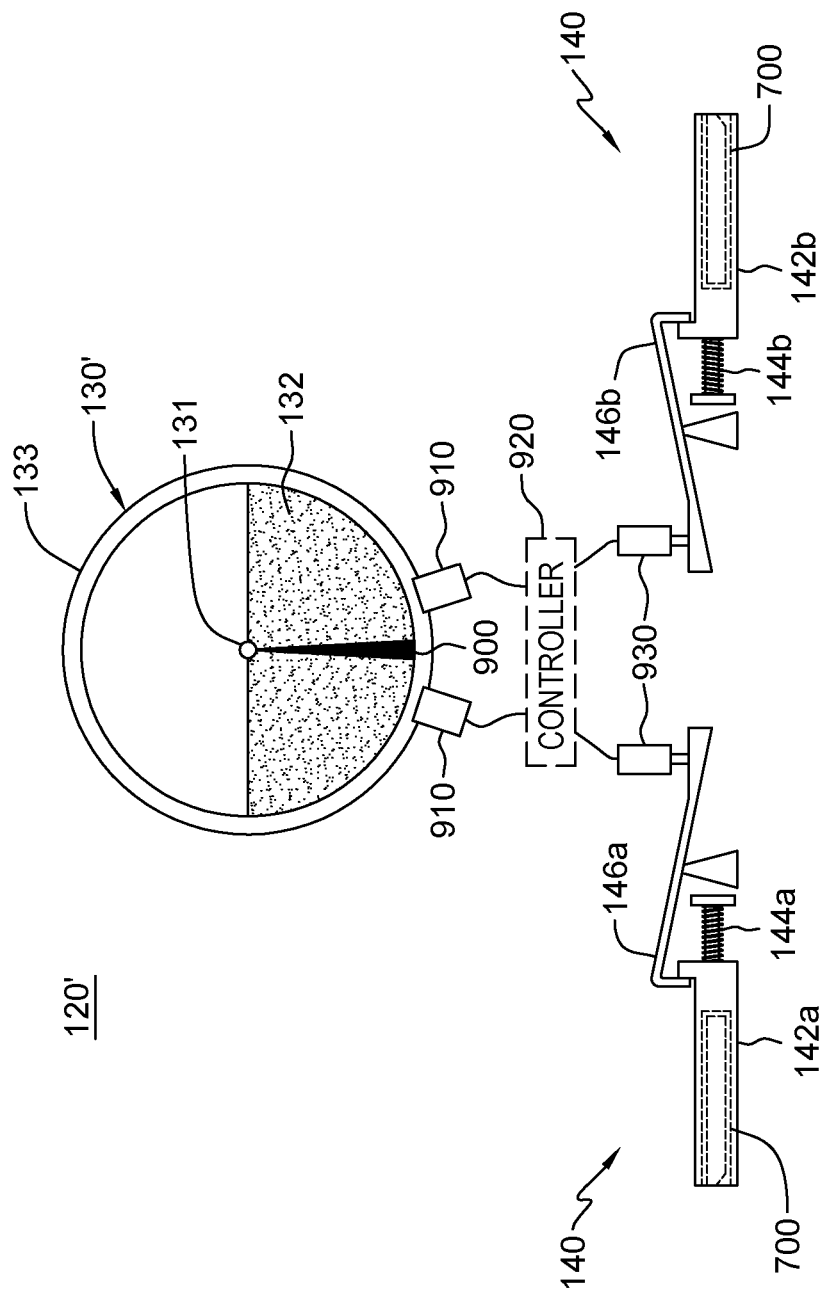

SELF-ACTUATING DEVICE FOR FACILITATING PREVENTING PRODUCT TIP OVER

BACKGROUND

Tip over of an apparatus, such as a machine, rack or other product, can result in bodily injury, as well as product damage. For instance, a computer rack, or palletized rack, or more generally a product, may be susceptible to a tip over incident during transportation. Depending on the configuration, a computer rack, machine, or other product, may have a relatively high center of gravity, making the product more susceptible to tip over. There are various events which may result in product tip over. For instance, a palletized rack may tip due to the pallet being lifted by a fork lift whose tines are not fitted to the pallet correctly, potentially resulting in damage to the palletized rack and/or components within the computer rack. There are numerous other potential causes for a tip over event of a product in transport, or more generally when being moved, such as when a data center is being reconfigured, with one or more computer racks being repositioned within the data center.

SUMMARY

Certain shortcomings of the prior art are overcome and additional advantages are provided through the provision, in one or more aspects, of a self-actuating device for facilitating preventing product tip over. The self-actuating device includes an anti-tip mechanism, an actuator, and at least one sensor. The anti-tip mechanism is configured to be associated with a product to facilitate preventing tip over of the product when in an extended state, and the actuator is configured to be associated with the product, and is configured and operatively coupled to automatically switch the anti-tip mechanism from a retracted state to the extended state based on the actuator detecting a tilt of a specified tilt angle. The actuator includes a weighted cylinder rotatable about an axis and an activation element associated with the weighted cylinder. The weighted cylinder is weighted in a lower portion thereof, and includes a slot. The activation element resides within the slot in the weighted cylinder. The at least one sensor monitors for a rotation of the activation element disposed within the weighted cylinder by the specified tilt angle, and thereby, tilting of the associated product by the specified tilt angle.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A depicts a further embodiment of a self-actuating device for facilitating preventing tip over of a product, with the anti-tip mechanism thereof shown in a retracted state, in accordance with one or more aspects of the present invention;

FIG. 9A depicts a further embodiment of a self-actuating device for facilitating preventing tip over of a product, with the outriggers of the anti-tip mechanism thereof shown retracted, in accordance with one or more aspects of the present invention;

DETAILED DESCRIPTION

Figure 1:
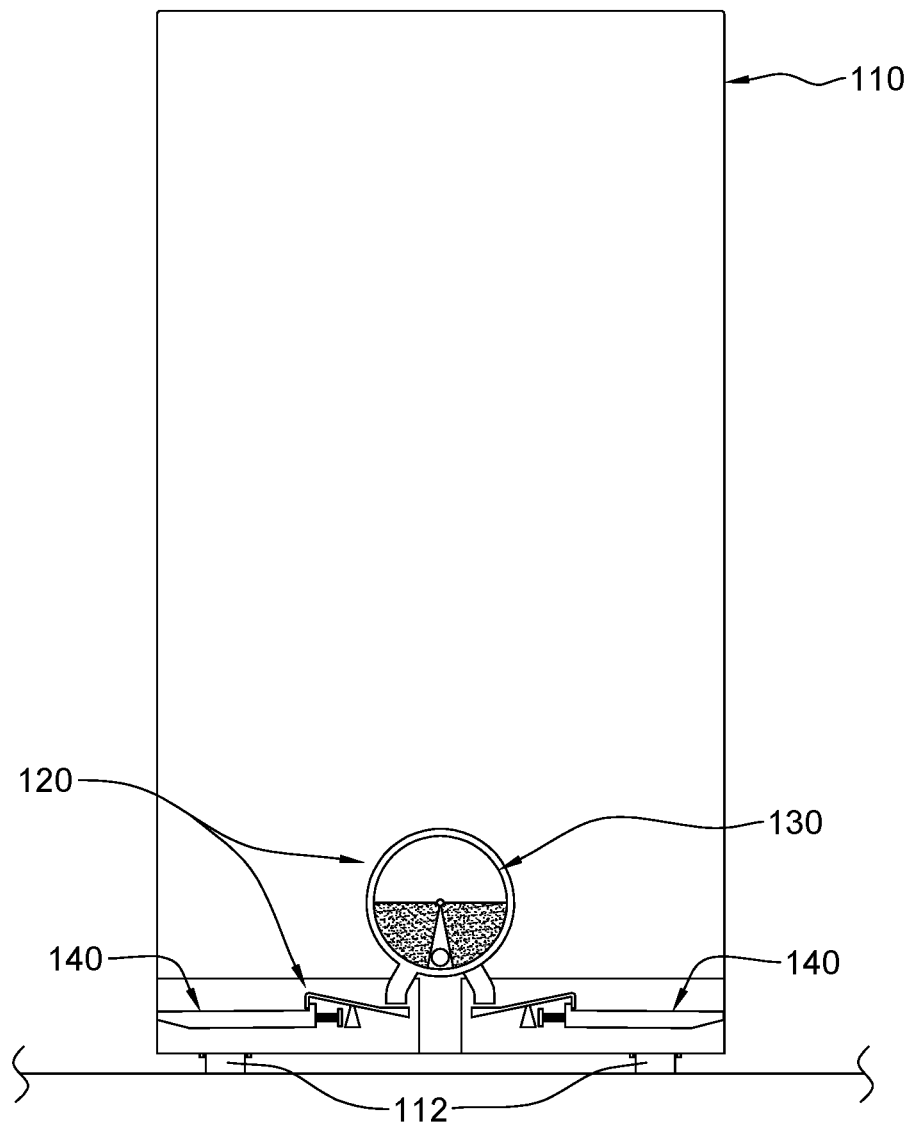
FIG. 1 depicts an exemplary product with one embodiment of a self-actuating device for facilitating preventing tip over of the product, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, providing a self-actuating device to resist product tip over.

The illustrative embodiments may be described below using specific designs, architectures, protocols, layouts, schematics, or tools only as examples, and are not limited to the illustrative embodiments. The illustrative embodiments may be used in conjunction with other comparable or similarly purposed structures, systems, applications, or architectures.

The examples in this disclosure are used only for clarity of description and are not limiting to the illustrative embodiments. Additional operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed herein.

Note that the term product is used herein to refer generally to any product, package, apparatus, machine, container, cabinet, rack, pallet, etc., that may benefit from having a tip over preventing device, such as disclosed herein. As one example, the product may be a computer rack, which conventionally may be of high value, and relatively tall, and potentially top heavy, and therefore prone to tipping during transport or other movement, such as when being moved within a data center.

Products, including computer racks, are often transported in packages that may include or reside on a pallet. The pallet may have a bottom deck board, a top deck board, and sidewalls between the top and bottom deck boards. The boards and sidewalls of the pallet define a pallet interior into which tines of a fork lift, pallet jack or other semi-manual device may be inserted so that the pallet, package and computer rack inside the package can be lifted off the ground and moved. Since the pallet interior has to be large enough to accommodate various types of tines, it is often the case that the pallet interior is significantly larger than the tines. In such situations, there can be a large gap between the tines and the bottom deck board, which may lead to instability during lift or a turn operation. If this instability is excessive, the pallet, the package and/or the rack inside the package may tilt, and if the tilt becomes significant enough, product tip over may result, potentially causing damage to the palletized rack and/or components within the computer rack, or even bodily injury if contacting an individual.

Other tip incidents can arise in other cases as well. For instance, a packaged product, or a product itself (which may be on rollers or legs), could apparently be seated securely within a vehicle for transport. However, should the vehicle accelerate or brake suddenly, or make a sharp turn, the product might still tip over. Further examples include the possibility of a tip over event occurring during moving or repositioning of a product, such as a computer rack within a data center, or as might occur during an earthquake.

Disclosed herein, in one or more aspects, are self-actuating devices and methods of fabricating the devices to facilitate preventing tip over accidents from occurring by providing for an automatic deployment of an outrigger (e.g., arm) upon detection of a tilt of a specified tilt angle. By way of example, the self-actuating device for facilitating preventing product tip over may include an anti-tip mechanism and an actuator. The anti-tip mechanism may be associated with the product to facilitate preventing tip over of the product when in an extended state. The actuator may also be associated with the product, and may be configured and operatively coupled to automatically switch the anti-tip mechanism from a retracted state to the extended state based on the actuator detecting a tilt of a specified tilt angle. For instance, a particular tilt angle in the range of 10°-15° may be specified, and once detected by the actuator, an outrigger (or arm) of the anti-tip mechanism may be automatically released or extended in the direction of the product tilt in order to facilitate preventing tip over of the product.

In one or more embodiments, the actuator may include a weighted cylinder rotatable or movable about an axis, and an activation element associated with the weighted cylinder. The weighted cylinder, in one or more implementations, may be weighted in a lower portion thereof. By way of example, the activation element may be a releasable element relative to the weighted cylinder. The releasable element may release to initiate transitioning of the anti-tip mechanism to the extended state based on the weighted cylinder rotating or transitioning by the specified tilt angle from level about the axis. In one or more embodiments, the releasable element moves to engage a hinged latch of the anti-tip mechanism when the weighted cylinder rotates by the specified tilt angle in a particular direction, and based thereon, the hinged latch releases an outwardly biased outrigger arm of the anti-tip mechanism in a direction of the tilt, thereby transitioning the anti-tip mechanism to the extended state.

In one or more embodiments, the weighted cylinder may include a slot, and the activation element may reside within the slot in the weighted cylinder. Further, the device may include at least one sensor for sensing rotation of the activation element disposed within the weighted cylinder by the specified tilt angle, and thereby, tilting of the associated product by the specified tilt angle. In one or more particular embodiments, the at least one sensor may include at least one optical sensor, magnetic sensor or capacitive sensor depending on the activation element employed.

In one or more embodiments, the anti-tip mechanism may include a deployable outrigger, with the outrigger extending outward relative to the product when the anti-tip mechanism is in the extended state. In one or more embodiments, the outrigger may include a telescoping arm.

In one or more implementations, the anti-tip mechanism may include a first deployable outrigger and a second deployable outrigger. The first outrigger may extend outward relative to the product in a first direction when extended, and the second outrigger may extend outward relative to the product in the second direction when extended, where the first and second directions are opposite directions. Further, the actuator may switch the anti-tip mechanism to extend the first outrigger in extended state based on the product tilting in the first direction by the specified tilt angle, and may switch the anti-tip mechanism to extend the second outrigger in extended state based on the product tilting in the second direction by the specified tilt angle.

In one or more embodiments, the anti-tip mechanism and the actuator may each be internally or externally coupled to the product, with the anti-tip mechanism being coupled to the product below the actuator. By way of example, the product may include one or more of a computer rack, machine, shipping crate, or a shipping pallet. In one or more embodiments, the anti-tip mechanism may include an outwardly biased outrigger, with the outwardly biased outrigger being released to rotate outward (e.g., downward) when the actuator automatically switches the anti-tip mechanism from the retracted state to the extended state.

FIG. 1 depicts one embodiment of an apparatus 100 comprising a product 110 with a self-actuating device 120 for facilitating preventing tip over of product 110. As illustrated, product 110 may be on casters 112, and self-actuating device 120 may be located within (or externally coupled to) a lower portion of product 110. In the embodiment depicted, self-actuating device 120 includes an actuator 130 and an anti-tip mechanism 140. As noted above, product 110 may be representative of any product, package, apparatus, machine, container, cabinet, rack, pallet, or other structure, etc., that may benefit from having a self-actuating, tip over preventing device, such as disclosed herein. By way of example only, product 110 may be described herein as being a computer rack (such as an IT rack), which as noted above, may be relatively tall and potentially top-heavy depending upon the arrangement of components within the rack.

Figure 2:
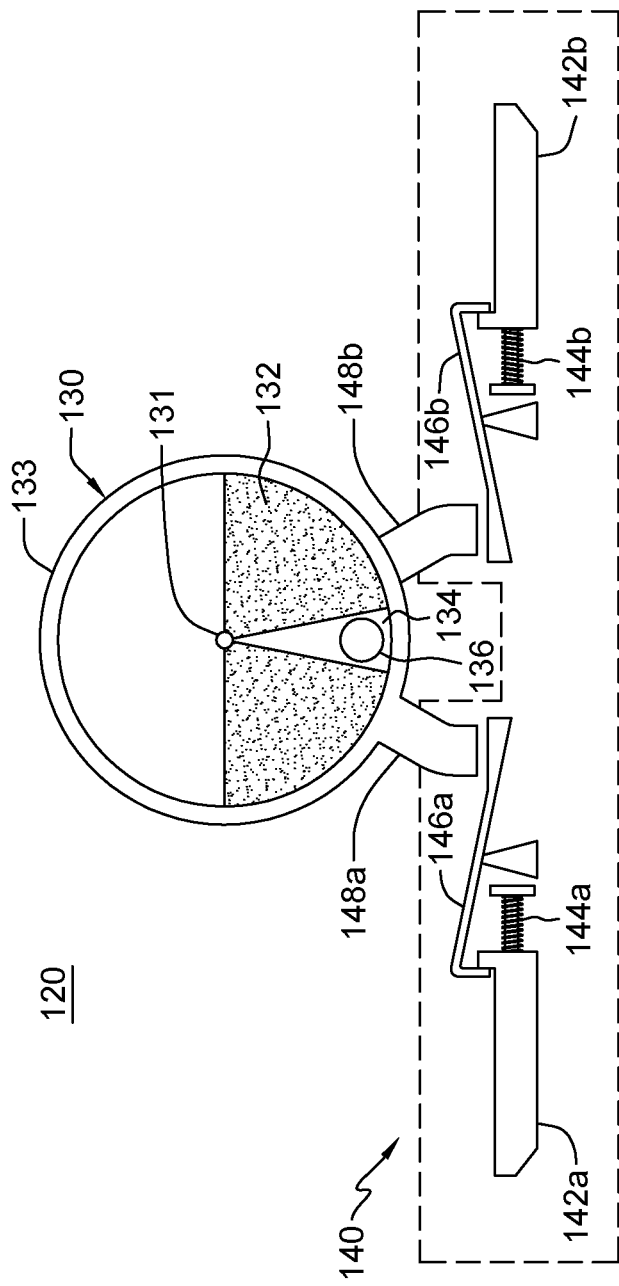
FIG. 2 is an enlarged depiction of the self-actuating device for facilitating preventing tip over of FIG. 1, in accordance with one or more aspects of the present invention.

FIG. 2 depicts an enlarged view of self-actuating device 120 of FIG. 1. As described herein, device 120 is an adaptive deployment outrigger device that may be used with relatively large products (such as system packages) to resist tip over of the product during shipping, relocation, or other event, such as an earthquake. Advantageously, this self-actuating device remains in retracted position when the associated product is relatively level, such as below a specified tilt angle. This allows the outriggers of the device to remain within the product, or for instance, within the footprint of the product, so as not to present a tripping hazard for service personnel. Further, the self-actuating device deploys one or more outriggers in a direction of tilt when required to resist tip over of the product. Depending on the implementations, the self-actuating device may require no power source, and therefore be battery independent.

By way of example, in the embodiment of FIG. 2, actuator 130 includes a weighted cylinder 132 which may rotate or move about an axis 131 within an outer sleeve or housing 133 with tipping or tilting of the device, and thus, the product when the device is associated with (e.g., coupled to) the product. In one or more implementations, weighted cylinder 132 is weighted in a lower portion thereof, and includes a slot 134, such as a notch or other opening configured as desired. Note that, in one or more embodiments, weighted cylinder 132 is weighted in the lower portion thereof to, for instance, prevent undue movement of weighted cylinder 132 during shock or vibration of the device or product with which self-actuating device 120 is associated.

In one or more embodiments, a releasable element 136, such as a weighted sphere, puck, etc., is disposed within slot 134. Releasable element 136 is designed to release (down a respective tube) when the associated product reaches a specified, critical tilt angle for which the device is designed. For instance, upon reaching a specified tilt angle, releasable element 136 travels down a respective tube (or conduit) 148a, 148b to contact a respective hinged latch 146a, 146b of anti-tip mechanism 140 in the direction of tilt. Note that self-actuating device 120 may be designed with any desired specified tilt angle by configuring sleeve 133 with one or more appropriate openings to allow for release of releasable element 136 down the appropriate tube 148a, 148b with actuator 130 detecting a tilt by the specified angle.

As illustrated, in the embodiment of FIGS. 1 & 2, anti-tip mechanism 140 may include a first outrigger 142a oriented to extend outward relative to the device (or product) in a first direction, and a second outrigger 142b oriented to extend outward relative to the device (or product) in the second direction, where the first and second directions are opposite directions. Further, actuator 130 automatically switches (e.g., via the releasable element) anti-tip mechanism 140 to extend first outrigger 142a in extended state based on the product tilting in the first direction (e.g., to the left in the figure) by the specified tilt angle, and switches the anti-tip mechanism to extend second outrigger 142b in extended state based on the product tilting in the second direction (e.g., to the right in the figure) by the specified tilt angle. More particularly, when tilted in the first direction by the specified tilt angle, releasable element 136 releases to travel down tube 148a to engage hinged latch 146a, and upon engagement with the latch, to release outrigger (or arm) 142a, which as shown may be spring biased 144a. As shown, releasing hinged latch 146a results in deploying outrigger 142a in the direction of the tilt to facilitate preventing (or resist) tip over of the product. Note that spring biasing 144a in this sense implies any deployment source sized to deploy or extend the outrigger, such as a mechanical spring, pneumatic device, electric coil, etc. That is, the spring biasing may be any deployment source that has the power to extend or deploy the associated outrigger. Conversely, should the device or product tilt in the second direction to the specified tilt angle, then releasable element 136 releases down tube 148b to engage hinged latch 146b, and thereby release outrigger 142b, which as noted is also spring biased 144b outward in a direction corresponding to the direction of product tilt.

Figure 3A:
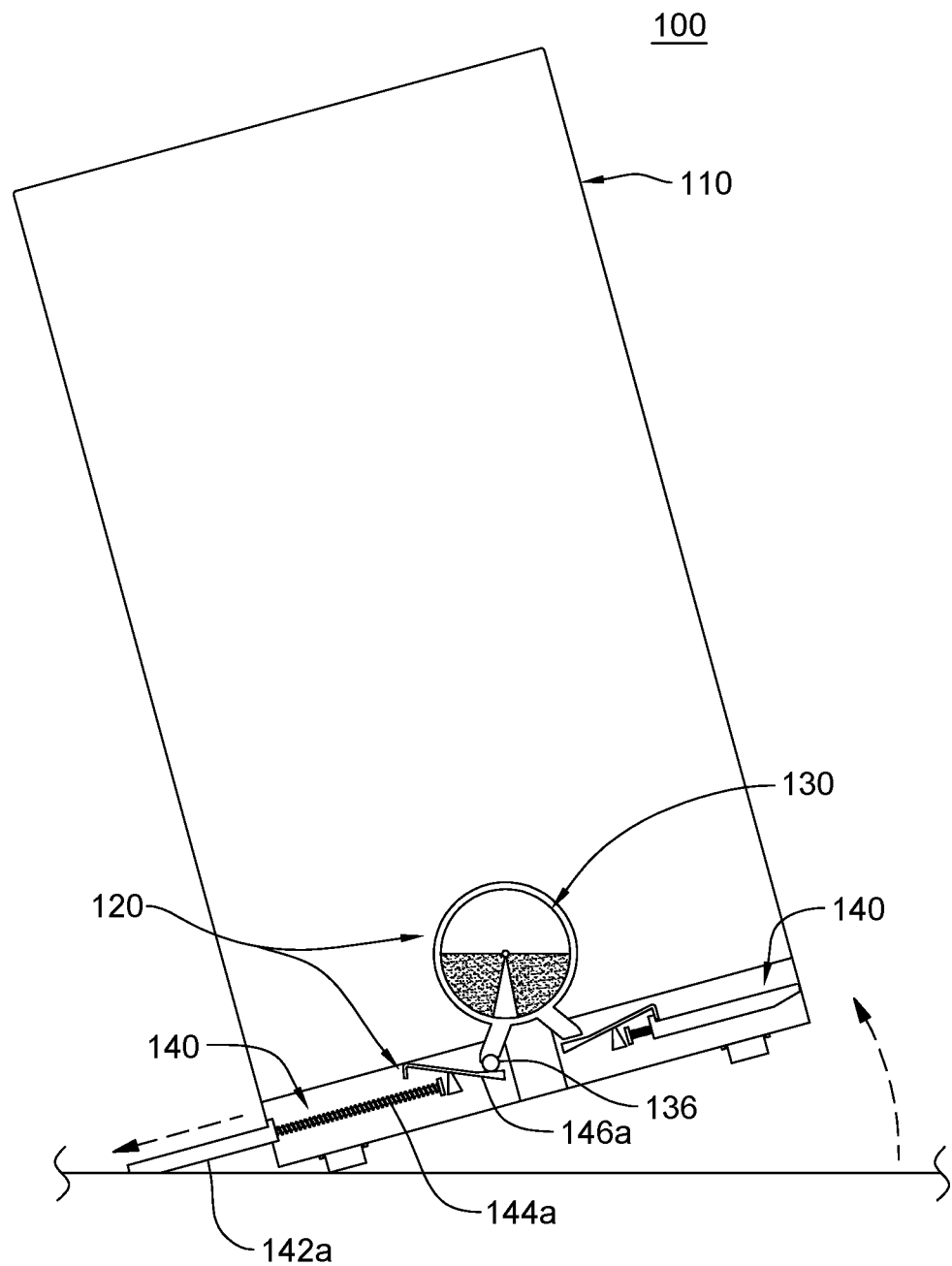
FIG. 3A depicts the product and self-actuating device of FIG. 1, with the product tilted and an outrigger of the device shown extended to facilitate preventing tip over of the product, in accordance with one or more aspects of the present invention.
Figure 3B:
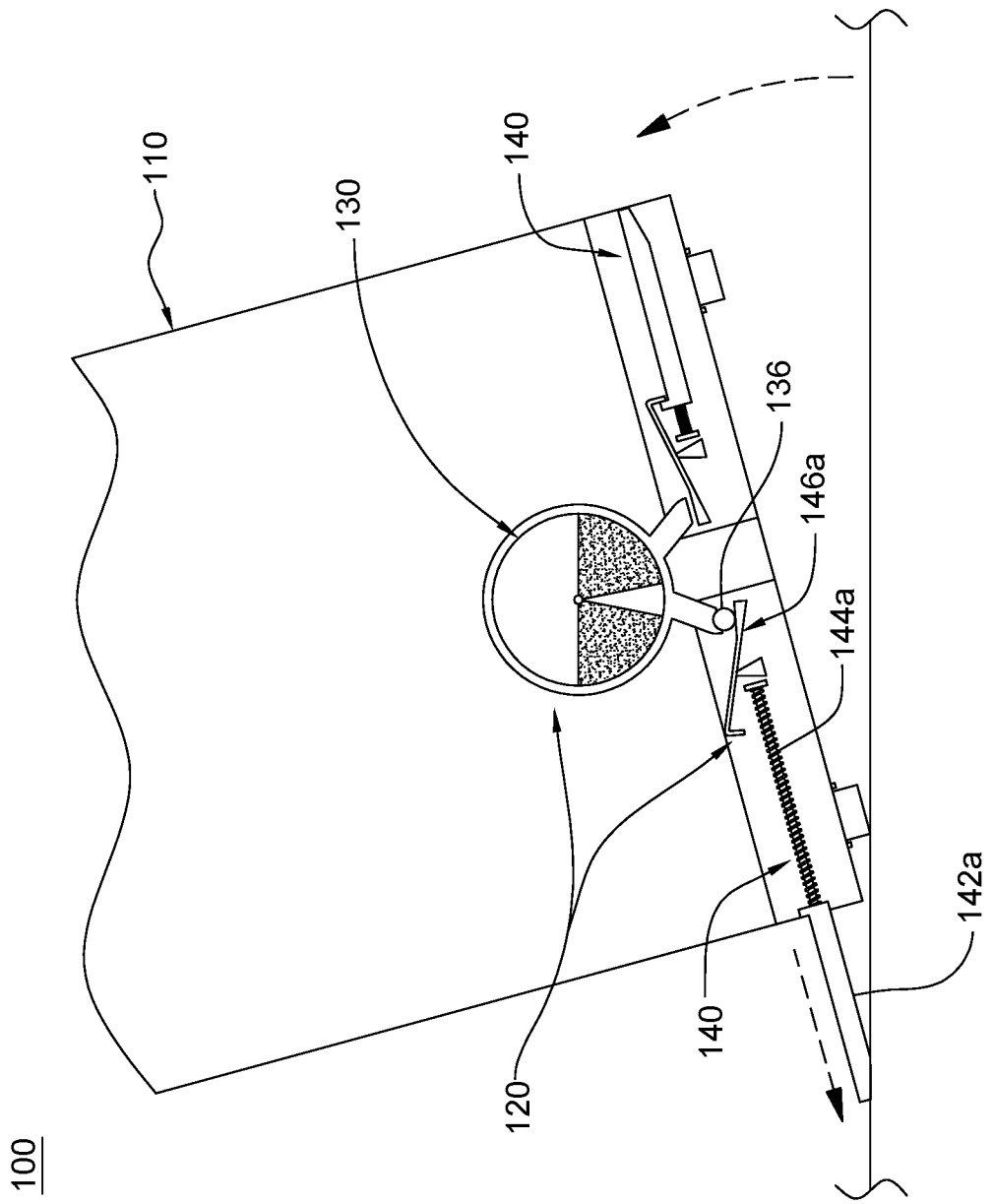
FIG. 3B is an enlarged partial depiction of the product and self-actuating device of FIG. 3A, in accordance with one or more aspects of the present invention.

FIGS. 3A & 3B depict a use example of self-actuating device 120 associated with product 110. In the example illustrated, product 110, with an associated self-actuating device 120, has tilted in a first direction by the specified tilt angle, thereby releasing releasable element 136 to transition down to hinged latch 146a, releasing outrigger 142a to deploy outward in the direction of the tilt, and thereby facilitate preventing or resisting further tilting or tip over of product 110. Note that in one or more embodiments, each individual outrigger may be configured to support the weight of the associated product when tilted at the specified tilt angle without collapsing. Further, in one or more implementations, the outrigger may be of sufficient length to reach or contact a surface upon which the product resides when deployed at the specified tilt angle. If desired, the outward ends of the outriggers may be configured to facilitate contacting and gripping the support surface when deployed at the critical angle. Further, the spring biasing of the outriggers may also operate as a built-in shock absorber as the outrigger fully deploys and initially contacts the support surface or floor.

In one or more embodiments, self-actuating device 120 may be integrated within product 110, or could be externally attached along a side of product 110, if desired. Further, as explained below, device 120 could be associated with or integrated with packaging surrounding an apparatus to be protected, or even associated with a pallet upon which the apparatus resides, whether packaged or unpackaged, with the assembly to be protected referred to herein as the product.

Figure 4:
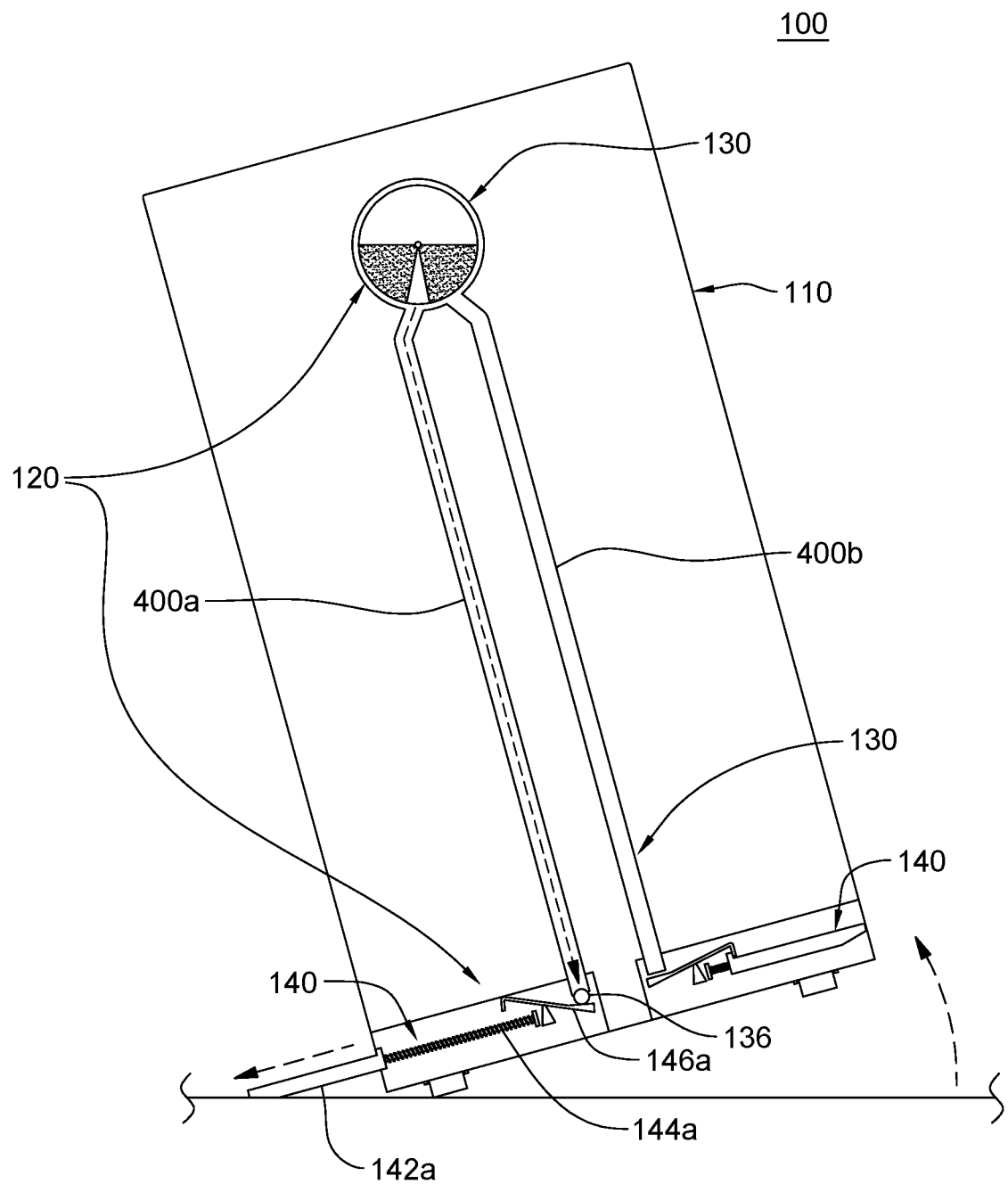
FIG. 4 depicts the product with another embodiment of a self-actuating device for facilitating preventing tip over of the product, where the product is shown titled and an outrigger of the device is extended, in accordance with one or more aspects of the present invention.

FIG. 4 depicts a variation on self-actuating device 120 of FIGS. 1-3B, wherein actuator 130 is shown disposed in an upper portion of product 110, and coupled via respective elongated tubes 400a, 400b to anti-tip mechanism 140. With the exception of elongated tubes 400a, 400b in place of tubes 148a, 148b of the embodiment of FIGS. 1-3B, the device, including actuator 130 and anti-tip mechanism 140 may be substantially identical to that described above. This particular implementation may be advantageous where there is limited room in the lower portion of product 110 for actuator 130 to reside.

Figure 5B:
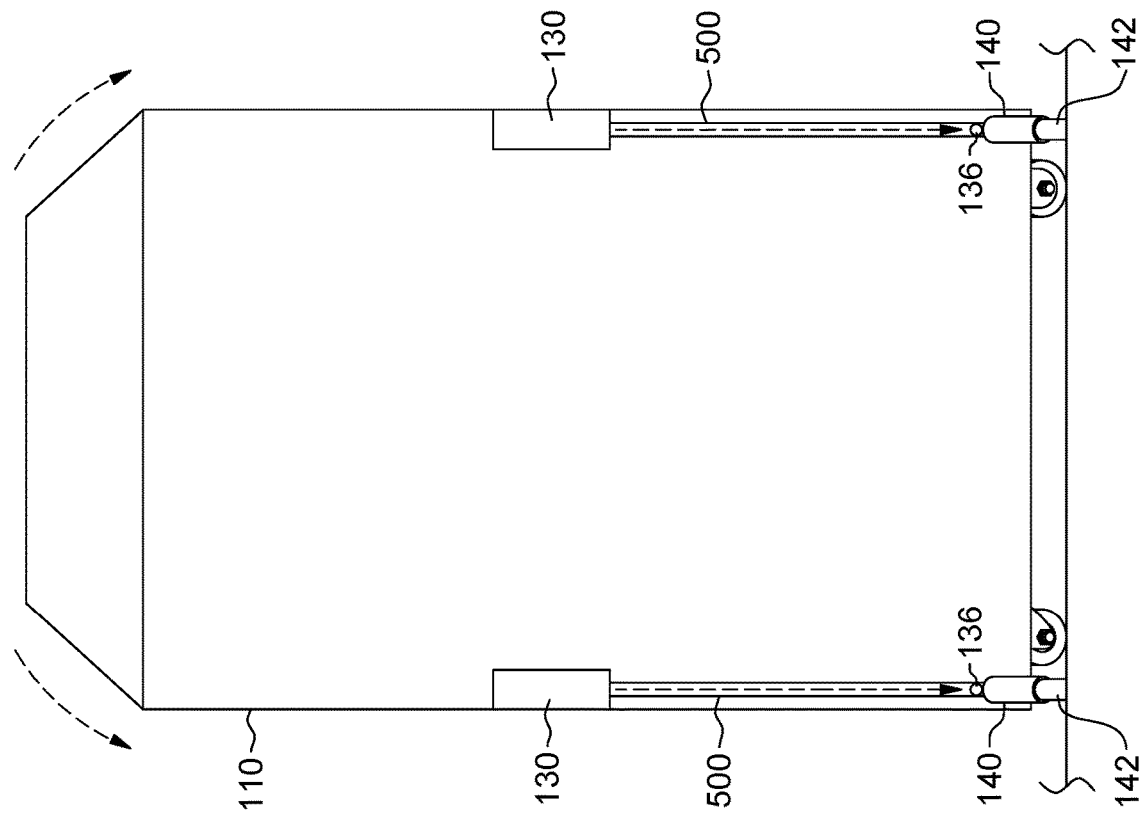
FIG. 5B depicts the product with another embodiment of a self-actuating device for preventing tip over of the product, in accordance with one or more aspects of the present invention.
Figure 5A:
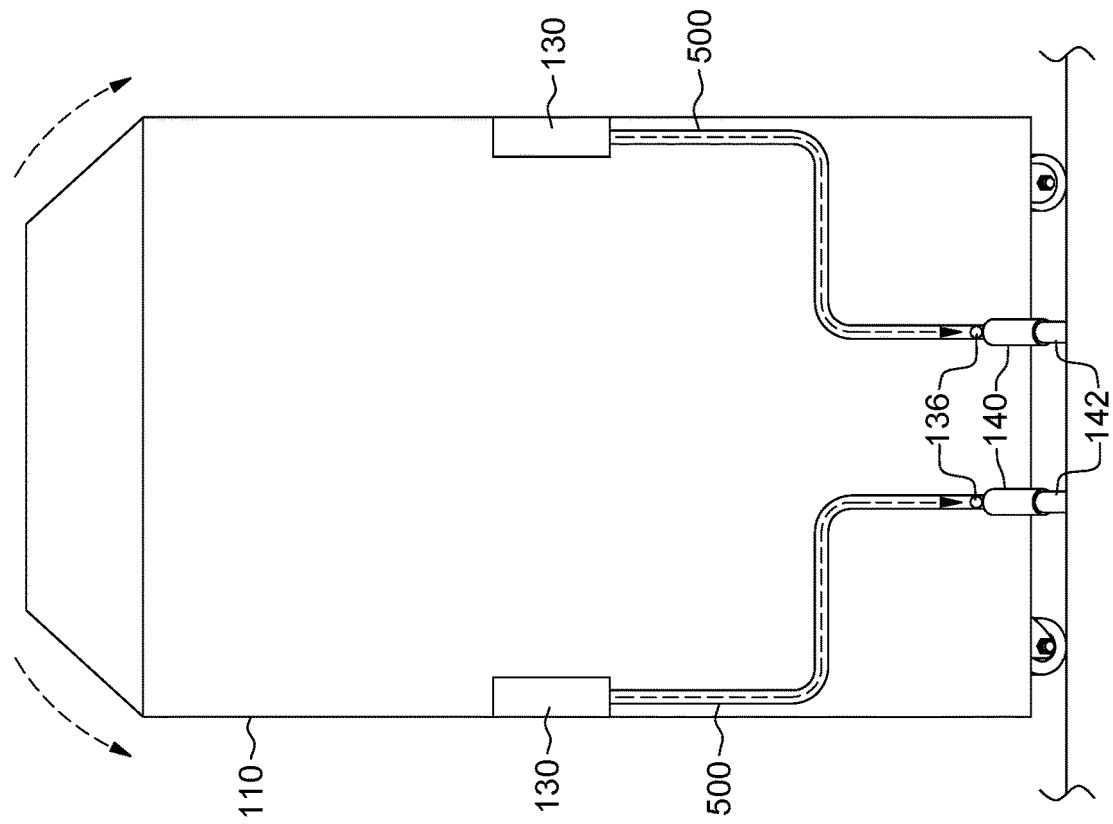
FIG. 5A depicts the product with a further embodiment of a self-actuating device for preventing tip over of the product, in accordance with one or more aspects of the present invention.

Further variations are depicted in FIGS. 5A & 5B. In FIG. 5A, two devices 120 are shown, each with an actuator 130 and an anti-tip mechanism 140 such as described above. In one or more embodiments, the anti-tip mechanisms may be disposed in the middle of the product 110 for possible outrigger 142 deployment, such as shown in FIG. 5A. In this case, the releasable elements 136 associated with the respective self-actuating devices 120 are shown released down respective tubes 500 to contact the respective hinged latches of the two anti-tip mechanisms 140, thereby having released respective outriggers 142 in the direction of tilt. Note that tubes 500 may be of any desired configuration to allow for passage of the respective releasable elements 136 from actuators 130 to the corresponding anti-tip mechanism 140 upon the actuator detecting a tilt of the specified tilt angle in a particular direction, as described herein.

In the example of FIG. 5B, two devices 120 are again shown. In this case, devices 120 are disposed, by way of example, at the front and rear sides of product 110 to again allow for two outriggers (or arms) to extend in the case of tilting product 110 in a first direction by the specified tilt angle, or in the second direction (or opposite direction) by the specified tilt angle. Note that if desired, one or more devices 120 could also be positioned substantially perpendicular to devices 120 of FIGS. 5A & 5B to extend outward in a front direction or to extend outward in a backward direction should product 110 tilt in either of those directions by a specified tilt angle as well. Note also that if desired, different devices associated with the product may have different specified tilt angles. For instance, where present, front and backward tilt preventing devices may have a different specified tilt angle than sideways tilt preventing devices.

Figure 6A:
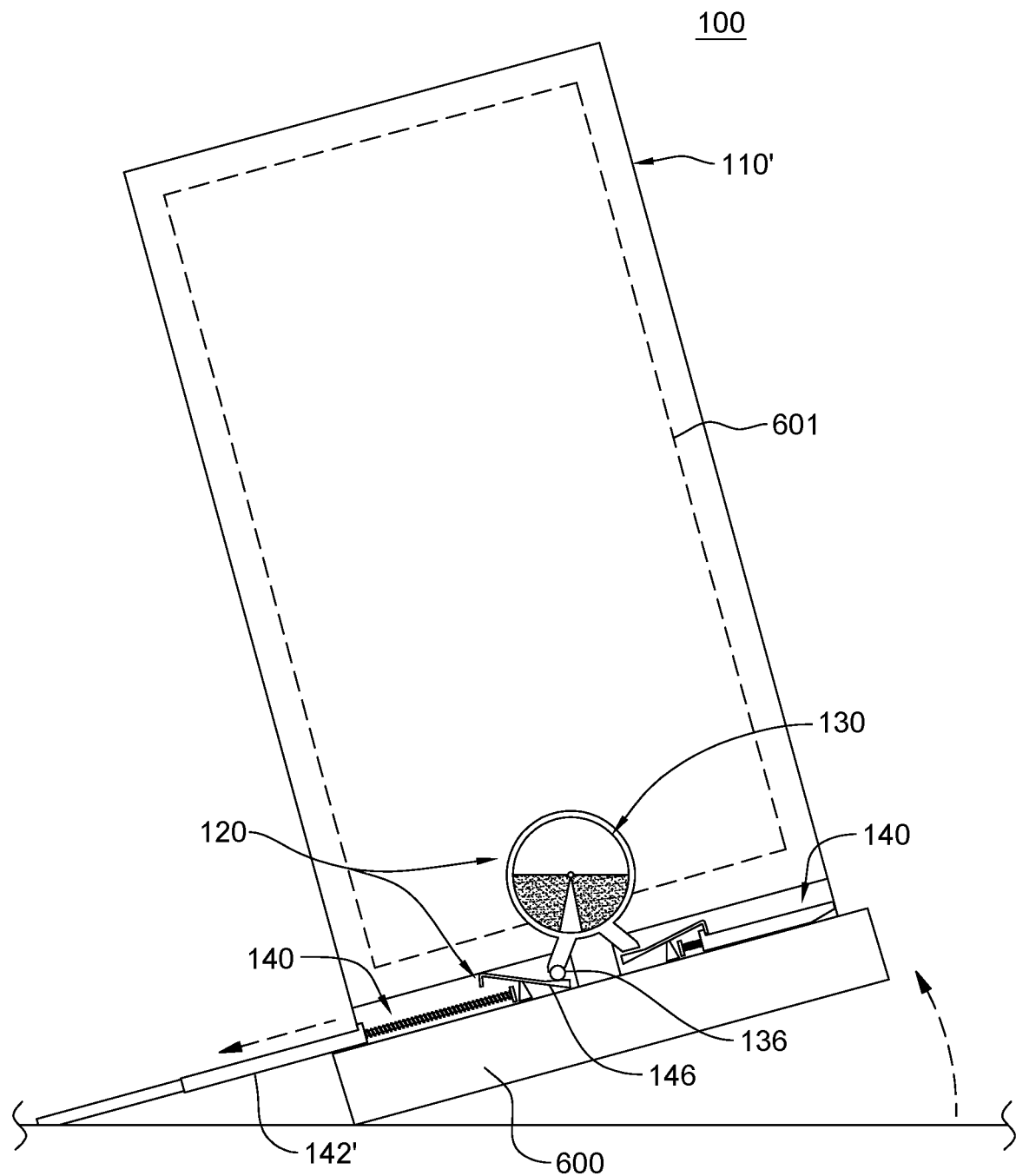
FIG. 6A depicts a further embodiment of a product with a self-actuating device for facilitating preventing tip over of the product, where the product is shown titled and an outrigger of the device is extended, in accordance with one or more aspects of the present invention.
Figure 6B:
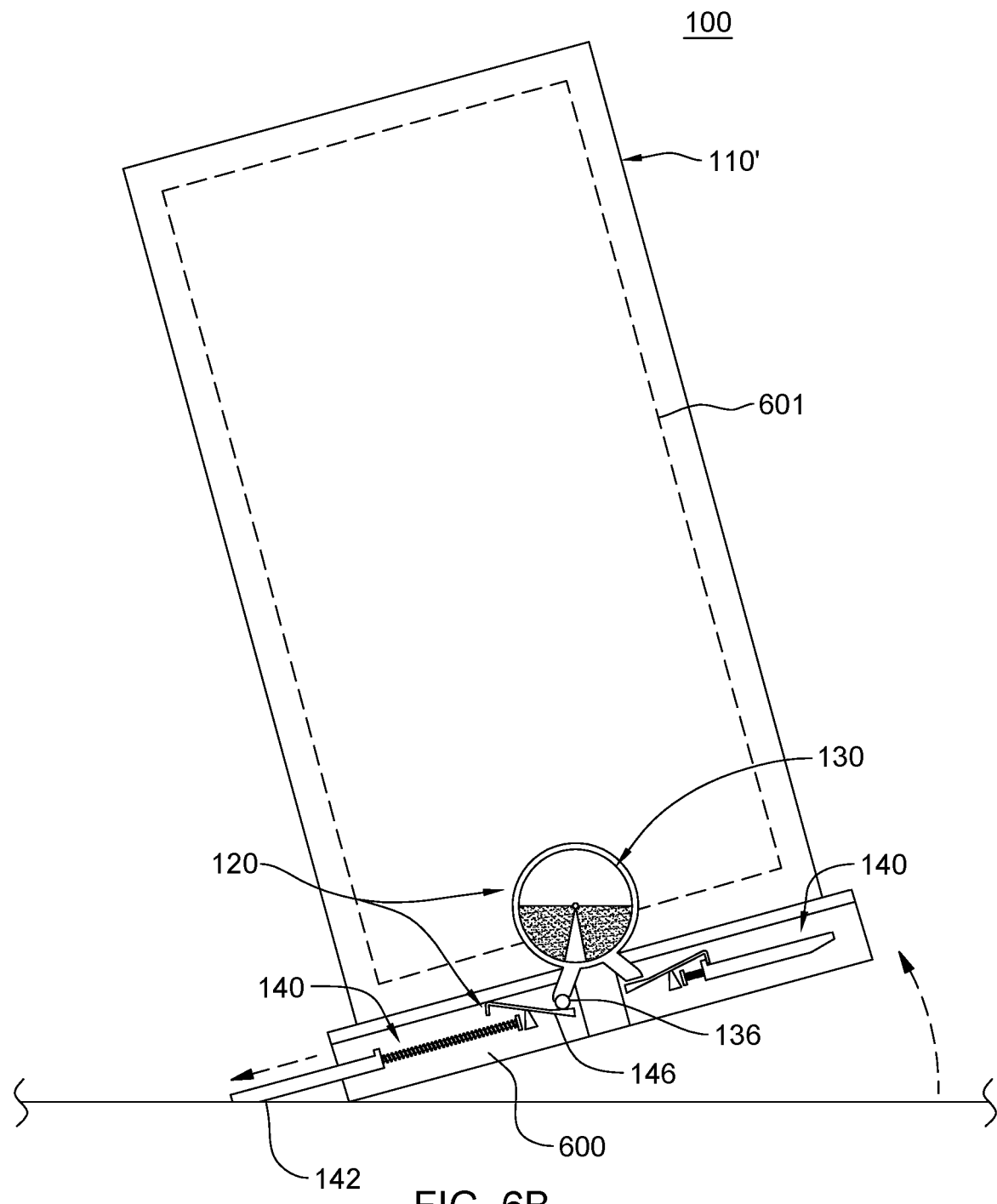
FIG. 6B depicts a further embodiment of a product with a device for facilitating preventing tip over of the product, where the product is shown titled and an outrigger of the device is extended, in accordance with one or more aspects of the present invention.

FIGS. 6A & 6B depict further variations on the product with which the device may be associated. In FIG. 6A, self-actuating device 120 is shown associated with a product 110' that includes packaging, such as a box or crate, containing an apparatus 601. In such a case, the device 120 may be located on the inside or outside of product 110', such as between the packaging and the apparatus within the packaging. Appropriate openings may be provided in product 110' aligned to the deployable outriggers (or arms) 142' of device 120. In the embodiment shown, product 110' may be a palletized product, with the package sitting on a pallet 600 to which the package may be affixed, in one or more embodiments. Note that in the embodiment of 6A, the outrigger 142' of device 120 may be sized longer due to the presence of pallet 600. For instance, the outrigger 142' may be configured to extend out 2-3', if needed to contact the support surface and facilitate preventing tip over of product 110' upon reaching the critical angle.

FIG. 6B depicts a similar product 110' to FIG. 6A, however, self-actuating device 120 is embodiment shown associated with pallet 600 of product 110', rather than the packaging of the palletized product. In particular, actuator 130 may be coupled to pallet 600 along with anti-tip mechanism 140. In the example shown, outrigger 142 has been deployed to extend in the direction of tilt by releasable element 136 having contacted hinged latch 146 upon tilting of product 110' by the specified tilt angle, as described above. As with the example of FIGS. 5A & 5B, multiple self-actuating devices 120 may be associated with the product of FIG. 6A or 6B, that is, multiple devices may be associated with packaging of an apparatus, and/or a pallet upon which the apparatus is being transported or shipped, collectively referred to herein as the product.

Figure 7B:
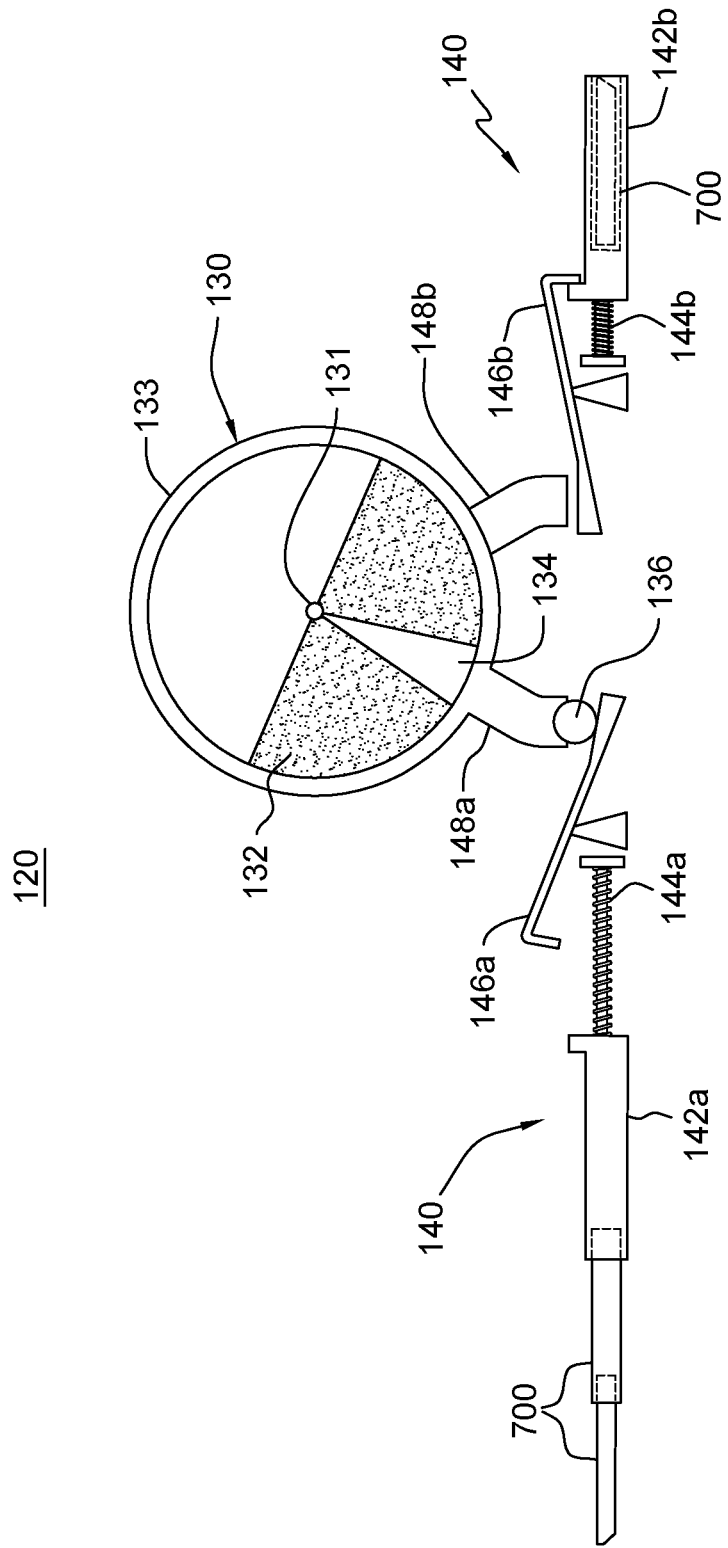
FIG. 7B depicts the self-actuating device embodiment of FIG. 7A, with the anti-tip mechanism thereof shown in an extended state, in accordance with one or more aspects of the present invention.

FIGS. 7A & 7B depict a further variation on self-actuating device 120, where the respective outriggers 142a, 142b include telescoping arms 700, which further extend out the length of each outrigger when deployed, if necessary to contact the product support surface, and thereby inhibit or facilitate preventing tip over of the associated product. In FIG. 7A, the anti-tip mechanism 140 of device 120 is shown in retracted state, while in FIG. 7B, anti-tip mechanism 140 is shown in extended state, with one of the outriggers 142a, and the telescoping arms 700 thereof, shown extended, by way of example. This deployment results from actuator 130 having detected a tilt of the specified tilt angle, and the releasable element 136 having traveled to engage the respective hinged latch 146a, which released the outrigger as shown. Note that the length of the outrigger 146a or telescoping arm 700 could be based on how tall the product is. For instance, the length of the outrigger may be 1-2', depending on the implementation. Telescoping of the arm or outrigger advantageously may reduce the seated length of the outrigger within the self-actuating device associated with the product, and therefore making it easier to couple the device to the product.

Figure 8:
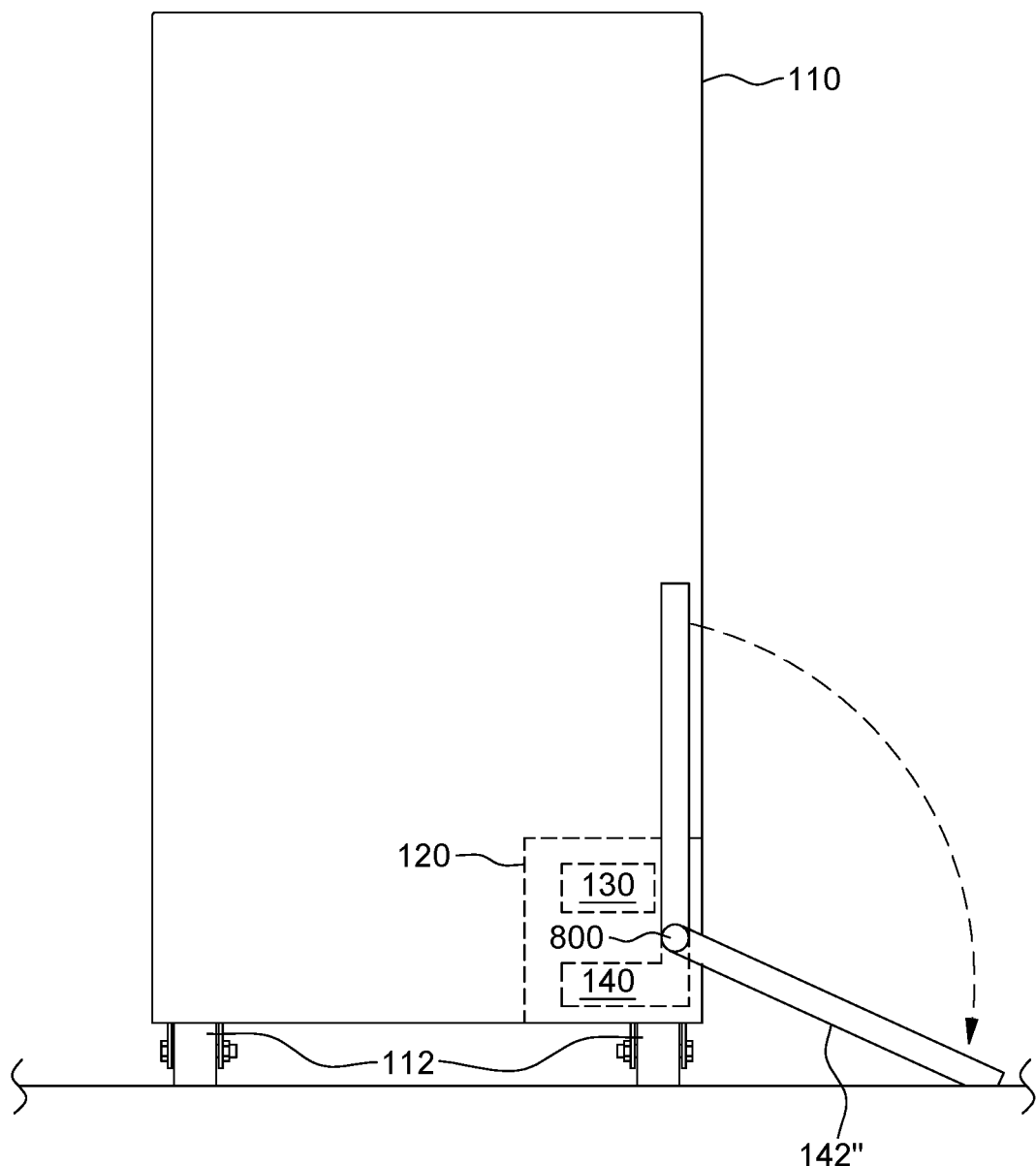
FIG. 8 depicts a product with another embodiment of a self-actuating device for facilitating preventing tip over of the product, in accordance with one or more aspects of the present invention.

In FIG. 8 a product 110 is shown with a self-actuating device 120 such as described above in connection with FIGS. 1-7B, wherein the device has a variation in that the outrigger or arm 142" is configured to pivot or swing outward, whether downward as illustrated or laterally outward in a horizontal plane (not shown) about an axis 800 when deployed. Note that, as with the above described embodiments, the outrigger may be a piston, rod, bar, etc., that may or may not telescope, such as in the examples of FIGS. 7A & 7B. Note that in the embodiments disclosed herein, product 110 may have appropriately sized openings where required to allow the outrigger to extend when the anti-tip mechanism transitions to extended state, assuming, that is, that the device is disposed within the product 110 and not external to the product.

Figure 9B:
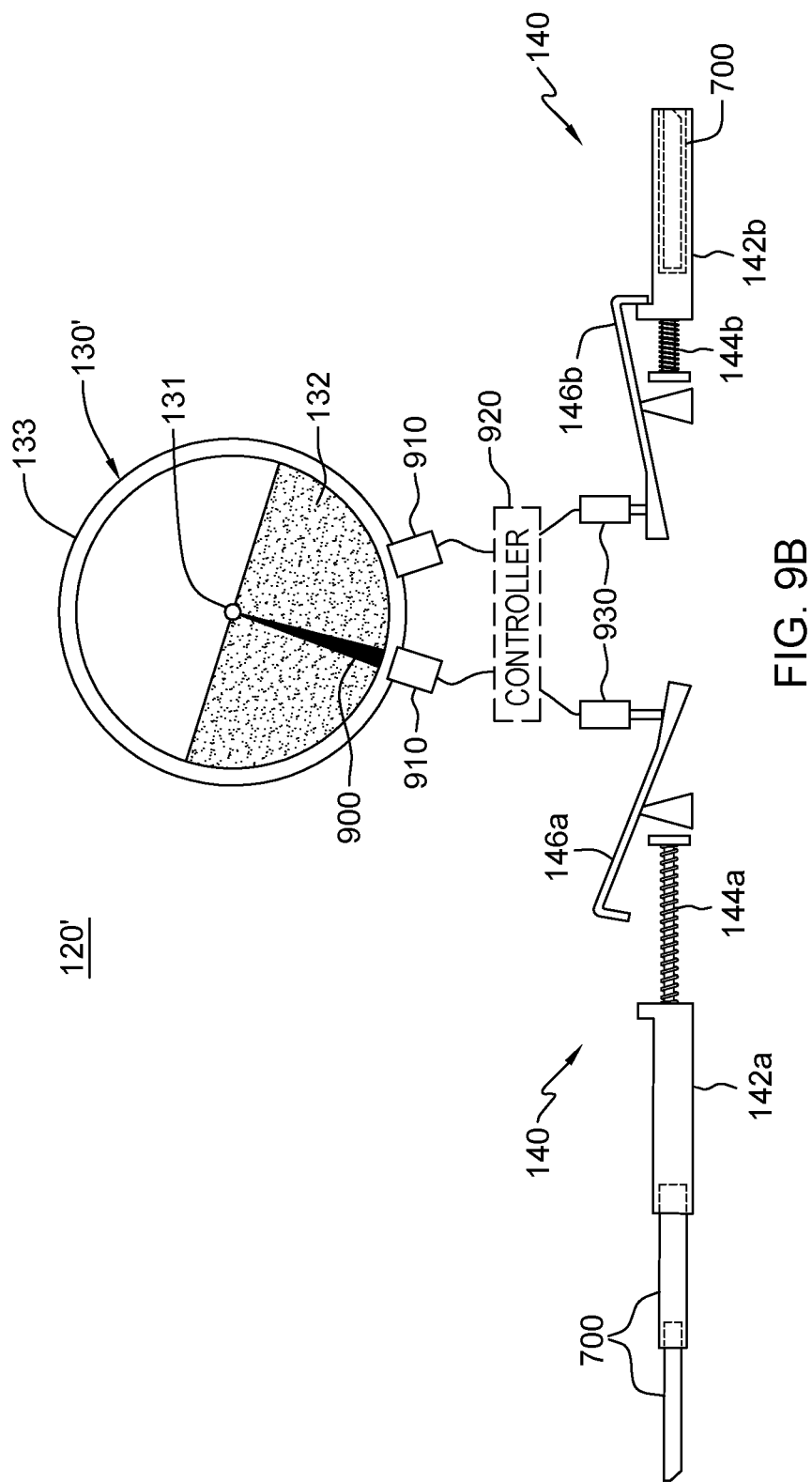
FIG. 9B depicts the self-actuating device embodiment of FIG. 9A, with an outrigger of the anti-tip mechanism thereof shown extended, in accordance with one or more aspects of the present invention.

FIGS. 9A & 9B depict a further embodiment of a self-actuating device 120', such as self-actuating device 120 described above. In this configuration, the actuator 130' again includes a weighted cylinder 132 which rotates or moves about an axis 131 within a sleeve or housing 133. As described above, weighted cylinder is weighted in a lower portion thereof to prevent undesired deployment of one or more outriggers due to shock or vibration experienced by the associated product. A slot 900 (such as a notch, slit or opening or cavity) is provided in weighted cylinder 132, which contains an activation element 901, which as depicted in FIG. 9A may be positioned to depend downward by the action of gravity on weighted cylinder 132 when the associated product is level. First and second sensors 910 are provided at a specified tilt angle relative to this level position of activation element 901. Upon the weighted cylinder rotating sufficiently for activation element 901 to be sensed by one of the sensors 910, a signal may be sent to a controller 920 which may then power a respective solenoid 930 to actuate a corresponding hinged latch 146 of the anti-tip mechanism 140 to release the corresponding outrigger 142 in the direction of tilt, as depicted in FIG. 9B. Note that controller 920 may be any of a variety of control mechanisms, including a computer control mechanism. Note also that sensor(s) 910 may be fixed or movable to adjust the specified tilt angle, as desired for a particular product implementation. Further, in one or more implementations, controller 920 may be configured to record desired information. For instance, controller 920 may be configured to log tilt angles experienced during shipment of the product.

Figure 10:
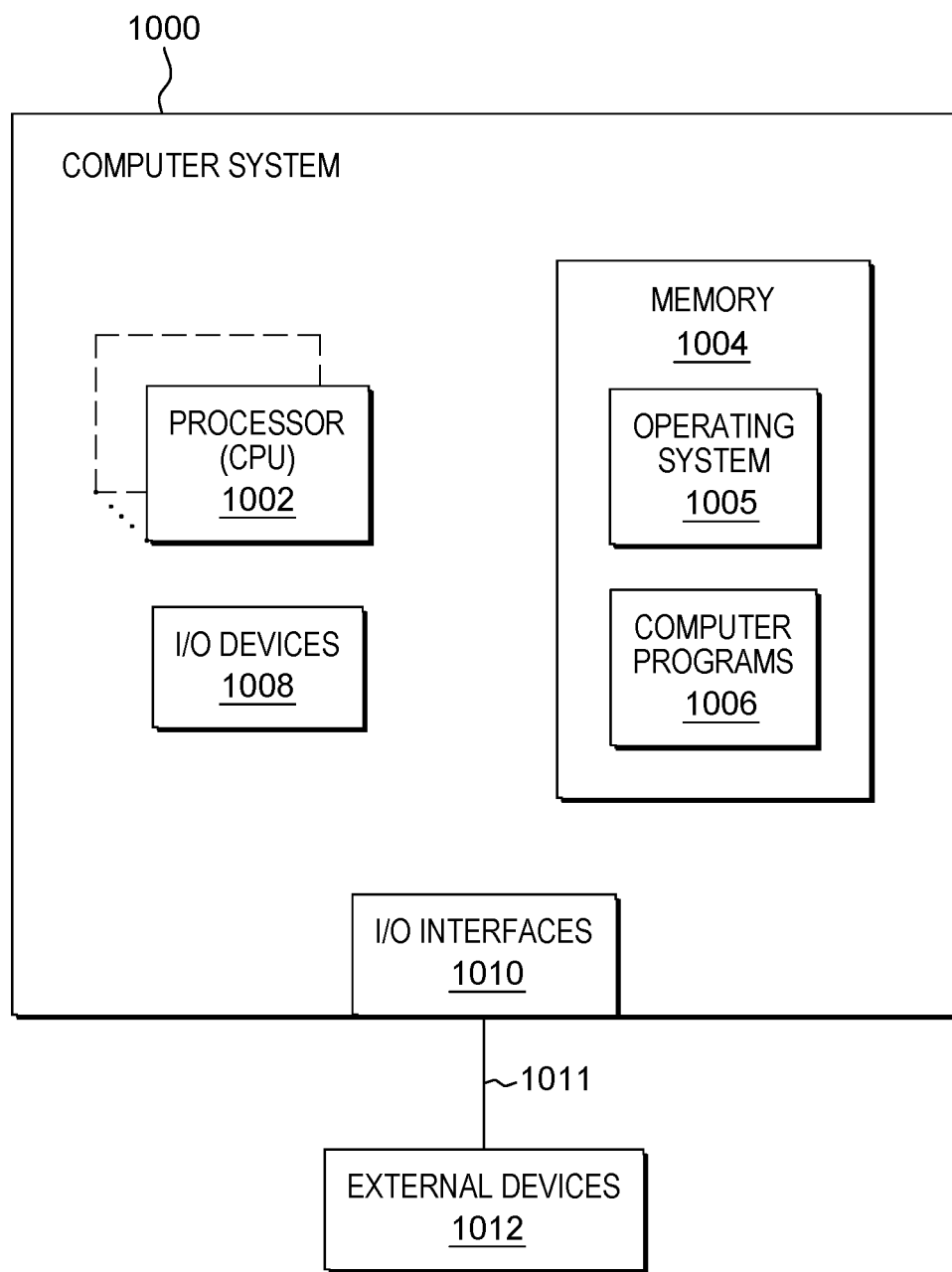
FIG. 10 depicts one example of a computer environment to incorporate or facilitate implementing one or more aspects of the present invention.

One or more aspects of the tilt angle monitoring and automatic release of the outrigger arm of the anti-tip mechanism may be performed by, implemented in association with, or otherwise facilitated by a computer system, one embodiment of which is depicted in FIG. 10. A computer system may be based on one of various system architectures and/or instruction set architectures, such as those offered by International Business Machines Corporation (Armonk, N.Y., USA), Intel Corporation (Santa Clara, Calif., USA) or ARM Holdings PLC (Cambridge, England, United Kingdom), as examples.

FIG. 10 shows a computer system 1000 in communication with external device(s) 1012. Computer system 1000 includes one or more processor(s) 1002, for instance, central processing unit(s) (CPUs). A processor can include functional components used in the execution of instructions, such as functional components that fetch program instructions from locations such as cache or main memory, decode program instructions, execute program instructions, access memory for instruction execution, and write results of the executed instructions. A processor 1002 can include register(s) to be used by one or more of the functional components. Computer system 1000 also includes memory 1004, input/output (I/O) devices 1008, and I/O interfaces 1010, which may be coupled to processor(s) 1002 and each other via one or more busses and/or other connections. Bus connections represent one or more of any of several types of bus structures, including a memory bus or memory controller, a peripheral bus, and a processor or local bus using any of a variety of bus architectures known in the art.

Memory 1004 can be or include main or system memory (e.g., random access memory) used in the execution of program instructions, a storage device(s) such as hard drive(s), flash media or optical media as examples, and/or cache memory, as examples. Memory 1004 can include, for instance, a cache, such as a shared cache, which may be coupled to local caches (examples include L1 cache, L2 cache, etc.) of processor(s) 1002. Additionally, memory 1004 may be or include at least one computer program product having a set (e.g., at least one) of program modules, instructions, code or the like that is/are configured to carry out the functions of various control aspects described herein when executed by one or more processors.

Memory 1004 can store an operating system 1005 and other computer programs 1006, such as one or more computer programs/applications that execute to perform aspects described herein. Specifically, program/applications can include computer readable program instructions that may be configured to carry out functions of embodiments of aspects described herein.

Examples of I/O devices 1008 include but are not limited to accelerometers, magnetometers, and/or other sensor devices coupled to, for instance, sense tilt angle, etc. An I/O device may be incorporated into the computer system as shown, though in some embodiments in I/O device may be regarded as an external device 1012 coupled to the computer system through one or more I/O interfaces 1010.

Computer system 1000 may communicate with one or more external devices 1012 via one or more I/O interfaces 1010. Example external devices include any device that enables computer system 1000 to communicate with one or more other devices, such as an anti-tip mechanism described herein. A communication between I/O interfaces 1010 and external devices 1012 can occur across wired and/or wireless communication link(s) 1011, such as ethernet based wired or wireless connections. Example wireless connections include cellular, Wi-Fi, Bluetooth®, proximity-based, near field, or other types of wireless connections. More generally, communication link(s) 1011 may be any appropriate wireless and/or wired communication link(s) for communicating data. Computer system 1000 may take any of various forms, well known examples of which include, but are not limited to, personal computer (PC) system(s), server computer system(s), laptop(s), tablet(s), multiprocessor system(s), multiprocessor-based system(s), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A self-actuating device for facilitating preventing product tip over, the self-actuating device comprising:
    an anti-tip mechanism configured to be associated with a product to facilitate preventing tip over thereof when in an extended state;
    an actuator configured to be associated with the product, the actuator being configured and operatively coupled to automatically switch the anti-tip mechanism from a retracted state to the extended state based on the actuator detecting a tilt of a specified tilt angle;

wherein:

the actuator comprises a weighted cylinder rotatable about an axis and an activation element associated with the weighted cylinder, the weighted cylinder being weighted in a lower portion thereof;

the weighted cylinder comprises a slot, and the activation element resides within the slot in the weighted cylinder; and at least one sensor for sensing a rotation of the activation element disposed within the weighted cylinder by the specified tilt angle, and thereby, tilting of the associated product by the specified tilt angle.

2. The self-actuating device of claim 1, wherein the at least one sensor comprises a sensor from the group consisting of an optical sensor, a magnetic sensor or a capacitive sensor.

3. The self-actuating device of claim 1, wherein the anti-tip mechanism comprises an outrigger, the outrigger extending outward relative to the product when the anti-tip mechanism is in the extended state.

4. The self-actuating device of claim 3, wherein the outrigger comprises a telescoping arm.

5. The self-actuating device of claim 1, wherein the anti-tip mechanism comprises a first outrigger and a second outrigger, the first outrigger extending outward relative to the product in a first direction when extended, and the second outrigger extending outward relative to the product in a second direction when extended, where the first direction and the second direction are opposite directions.

6. The self-actuating device of claim 5, wherein the actuator switches the anti-tip mechanism to extend the first outrigger in the extended state based on the product tilting in the first direction by the specified tilt angle, and switches the anti-tip mechanism to extend the second outrigger in the extended state based on the product tilting in the second direction by the specified tilt angle.

7. The self-actuating device of claim 1, wherein the anti-tip mechanism and the actuator are each coupled to the product, the anti-tip mechanism being coupled to the product below the actuator.

8. The self-actuating device of claim 1, wherein the product comprises at least one of a computer rack, a machine, a shipping crate, or a shipping pallet.

9. The self-actuating device of claim 1, wherein the anti-tip mechanism comprises an outwardly-biased outrigger, the outwardly-biased outrigger being released to rotate outward when the actuator automatically switches the anti-tip mechanism from the retracted state to the extended state.

* * * * *